US012575019B2

(12) United States Patent
Lee

(10) Patent No.: US 12,575,019 B2
(45) Date of Patent: Mar. 10, 2026

(54) PRINTED CIRCUIT BOARD ASSEMBLY AND METHOD FOR MANUFACTURING PRINTED CIRCUIT BOARD ASSEMBLY

(71) Applicant: SAMSUNG SDI CO., LTD., Yongin-si (KR)

(72) Inventor: Woojin Lee, Yongin-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 163 days.

(21) Appl. No.: 18/385,012

(22) Filed: Oct. 30, 2023

(65) Prior Publication Data

US 2024/0422891 A1 Dec. 19, 2024

(30) Foreign Application Priority Data

Jun. 13, 2023 (KR) ........................ 10-2023-0075711

(51) Int. Cl.
*H05K 1/02* (2006.01)
(52) U.S. Cl.
CPC ..... *H05K 1/02* (2013.01); *H05K 2201/10424* (2013.01)
(58) Field of Classification Search
CPC .......................................... H05K 2201/10424
USPC ................................................. 361/728, 752
See application file for complete search history.

(56) References Cited

U.S. PATENT DOCUMENTS 5,181,044 A * 1/1993 Matsumoto .......... H01Q 1/3275
343/700 MS
5,294,938 A * 3/1994 Matsuo .................... H01Q 9/40
343/872
5,353,194 A 10/1994 Libretti et al.
2002/0142632 A1 * 10/2002 Moore ...................... H01R 4/64
439/95
2004/0012931 A1 * 1/2004 Pitzele ................... H05K 7/142
361/748
2005/0116863 A1 * 6/2005 Yuanzhu .............. H01Q 1/3233
343/846
2008/0165511 A1 7/2008 Mayuzumi et al.
2013/0322040 A1 * 12/2013 Watanabe .............. H01L 23/60
361/760

(Continued)

FOREIGN PATENT DOCUMENTS

CN 103857236 A 6/2014
JP 07-045973 A 2/1995

(Continued)

OTHER PUBLICATIONS

European Search Report dated Oct. 7, 2024.

*Primary Examiner* — Hung S. Bui
(74) *Attorney, Agent, or Firm* — Lee IP Law, P.C.

(57) ABSTRACT

A printed circuit board assembly includes a printed circuit board including a plurality of support holes, a metal frame on which the printed circuit board is supported, and a plurality of bonding portions between the metal frame and the printed circuit board that bond the metal frame and the printed circuit board. The metal frame includes a plate portion opposite the printed circuit board, and a plurality of supports integral with the plate portion, bent and protruding from the plate portion and extending to the printed circuit board, each of the plurality of supports being inserted into each of the plurality of support holes and supporting the printed circuit board.

20 Claims, 9 Drawing Sheets

(56)         References Cited

U.S. PATENT DOCUMENTS

| | | | | |
|---|---|---|---|---|
| 2014/0301043 | A1* | 10/2014 | Onishi | .................. H05K 9/006 |
| | | | | 361/728 |
| 2016/0261009 | A1 | 9/2016 | Byun | |
| 2018/0153040 | A1 | 5/2018 | Wakabayashi | |
| 2020/0052610 | A1* | 2/2020 | Babic | .................... H05K 7/209 |

FOREIGN PATENT DOCUMENTS

| | | | |
|---|---|---|---|
| KR | 10-0741543 | B1 | 7/2007 |
| KR | 10-2238366 | B1 | 4/2021 |

* cited by examiner

PRINTED CIRCUIT BOARD ASSEMBLY AND METHOD FOR MANUFACTURING PRINTED CIRCUIT BOARD ASSEMBLY

CROSS-REFERENCE TO RELATED APPLICATION

This application claims priority to and the benefit of Korean Patent Application No. 10-2023-0075711 filed in the Korean Intellectual Property Office on Jun. 13, 2023, the entire contents of which are incorporated herein by reference.

BACKGROUND

1. Field

Embodiments relate to a printed circuit board assembly and a method for manufacturing a printed circuit board assembly.

2. Description of the Related Art

A printed circuit board (PCB) is used for mounting electronic components.

SUMMARY

Embodiments are directed to a printed circuit board assembly, including a printed circuit board having a plurality of support holes, a metal frame supporting the printed circuit board, and a plurality of bonding portions between the metal frame and the printed circuit board bonding the metal frame and the printed circuit board, wherein the metal frame includes a plate portion opposite the printed circuit board, and a plurality of supports that is integral with the plate portion, bent and extending from the plate portion to the printed circuit board, inserted into the plurality of support holes, and supporting the printed circuit board.

Accordingly to embodiments, the metal frame may further include a plurality of through-holes adjacent to the plurality of supports and penetrating the plate portion.

Accordingly to embodiments, a planar shape of the plurality of through-holes is the same as a side shape of the plurality of supports.

Accordingly to embodiments, the number of the plurality of through-holes is the same as the number of the plurality of supports.

Accordingly to embodiments, the plurality of supports are separated from the plurality of through-holes and bent from the plate portion to protrude from the plate portion.

Accordingly to embodiments, the metal frame further includes a plurality of through-hinges penetrating between the plurality of supports and the plate portion.

Accordingly to embodiments, the metal frame further comprises a plurality of connecting hinges that curve and connect between each of the plurality of supports and the plate portion with each of the plurality of through-hinges interposed therebetween.

Accordingly to embodiments, the plurality of through-hinges are linear.

Accordingly to embodiments, each of the plurality of supports includes an insertion portion inserted into each of the plurality of support holes, and a support portion extending from the insertion portion to the plate portion and supporting the printed circuit board.

Accordingly to embodiments, the support portion includes a side portion extending at an incline from the plate portion toward the printed circuit board, and an upper portion positioned between the side portion and the insertion portion and contacting the printed circuit board.

Accordingly to embodiments, each of the plurality of bonding portions has a different thickness.

Accordingly to embodiments, each of the plurality of bonding portions has a different area.

Accordingly to embodiments, each of the plurality of bonding portions includes older.

Accordingly to embodiments, the plurality of supports are closer to a corner of the plate portion than to a center of the plate portion.

Accordingly to embodiments, a method for manufacturing a printed circuit board assembly, includes separating a plurality of supports from a plate portion of a metal frame and bending the plurality of supports from the plate portion to protrude from the plate portion, supporting the printed circuit board on the metal frame by inserting the plurality of supports into a plurality of support holes of the printed circuit board, and bonding the metal frame and the printed circuit board using a plurality of bonding portions between the metal frame and the printed circuit board.

Accordingly to embodiments, the separating of the plurality of supports from the plate portion of the metal frame and bending the plurality of supports from the plate portion to protrude from the plate portion includes forming a plurality of through-holes adjacent to the plurality of supports and penetrating the plate portion on the metal frame.

Accordingly to embodiments, the separating of the plurality of supports from the plate portion of the metal frame and bending the plurality of supports from the plate portion to protrude from the plate portion is performed by separating the plurality of supports from the plurality of through-holes along a plurality of through-hinges penetrating between the plurality of supports and the plate portion, and bending the plurality of supports from the plate portion.

Accordingly to embodiments, the plurality of through-hinges are linear.

Accordingly to embodiments, the bonding of the metal frame and the printed circuit board by positioning the plurality of bonding portions between the metal frame and the printed circuit board is performed by soldering the plurality of bonding portions between the metal frame and the printed circuit board.

Accordingly to embodiments, each of the plurality of bonding portions has a different thickness.

According to embodiments, a printed circuit board assembly and a method for manufacturing the printed circuit board assembly in which a short circuit between the metal frame and the printed circuit board is suppressed by maintaining a constant distance between the metal frame and the printed circuit board, even if no separate structure is added between the metal frame and the printed circuit board, are provided.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
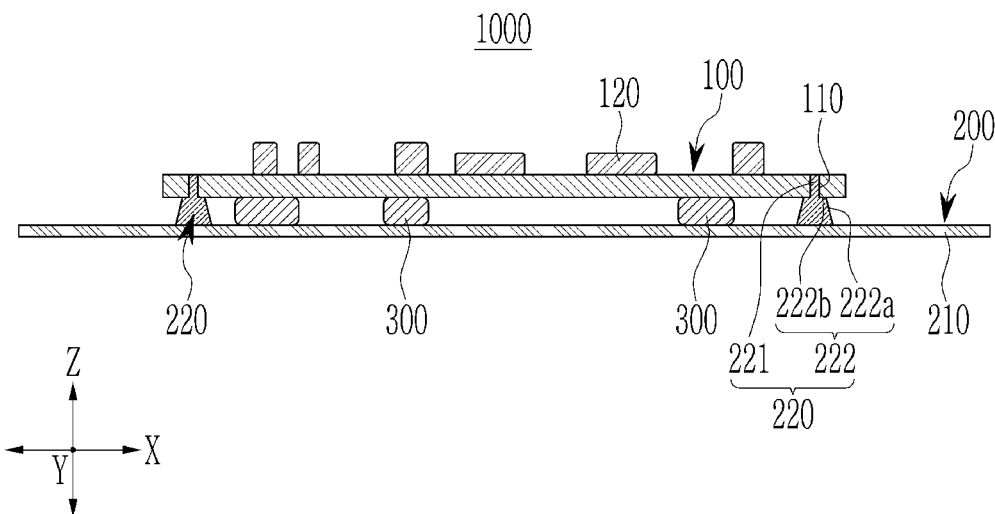
FIG. 1 is a cross-sectional view illustrating a printed circuit board assembly according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that if a layer or element is referred to as being "on" another layer or substrate, it can be directly on the other layer or substrate, or intervening layers may also be present. Further, it will be understood that if a layer is referred to as being "under" another layer, it can be directly under, and one or more intervening layers may also be present. In addition, it will also be understood that if a layer is referred to as being "between" two layers, it can be the only layer between the two layers, or one or more intervening layers may also be present. Like reference numerals refer to like elements throughout.

The terminology used herein is used to describe embodiments only, and is not intended to limit the present disclosure. The singular expression includes the plural expression unless the context clearly indicates otherwise.

In addition, unless explicitly described to the contrary, the word "comprises", "includes", or "have" and variations thereof are intended to designate the presence of an embodied feature, number, step, element, or a combination thereof, and will be understood to imply the inclusion of stated elements but it does not preclude the possibility of the presence or addition of one or more features, number, step, element, or a combination thereof.

Hereinafter, a printed circuit board assembly according to embodiments will be described with reference to FIGS. 1 to 4.

In an implementation, the printed circuit board assembly according to embodiments may be a printed circuit board assembly included in a protective circuit module of a secondary battery, but is not limited thereto, and may be a printed circuit board assembly including a printed circuit board assembly and a metal frame included in various known electronic devices.

FIG. 1 is a cross-sectional view illustrating a printed circuit board assembly according to an embodiment.

Referring to FIG. 1, a printed circuit board assembly 1000 according to embodiments may include a printed circuit board 100, a metal frame 200, and a plurality of bonding portions 300.

The printed circuit board 100 may include a plurality of support holes 110 positioned on the outside and a plurality of chips 120 mounted on the printed circuit board 100.

The plurality of support holes 110 may be positioned at corners of the printed circuit board 100 in a plan view, but are not limited thereto. A plurality of support holes 110 may penetrate the printed circuit board 100. A plurality of supports 220 of the metal frame 200 may be inserted into the plurality of support holes 110. By inserting the plurality of supports 220 into the plurality of support holes 110, the printed circuit board 100 may be supported by the metal frame 200 while maintaining a constant distance from the metal frame 200. The plurality of support holes 110 may have various planar shapes corresponding to the shapes of the plurality of supports 220. In an implementation, the plurality of support holes 110 may have various planar shapes such as polygons, including triangles, quadrangles, pentagons, and hexagons, as well as circular shapes, oval shapes, and irregular shapes.

The plurality of chips 120 may be mounted on the printed circuit board 100. The plurality of chips 120 may include various known electronic chips included in various known protective circuit modules of secondary batteries, but are not limited thereto, and may include electronic chips included in various known electronic devices.

The metal frame 200 may be bonded to the printed circuit board 100 using a plurality of bonding portions 300 therebetween. The metal frame 200 supports the printed circuit board 100. The metal frame 200 may have an area corresponding to the area of the printed circuit board 100, but is not limited thereto. The metal frame 200 may have an area and a structure corresponding to a region inside a case of the secondary battery on which the printed circuit board assembly included in the protective circuit module of the secondary battery is mounted. In some embodiments, the metal frame 200 may have an area and structure corresponding to a region of various known electronic devices.

Figure 2:
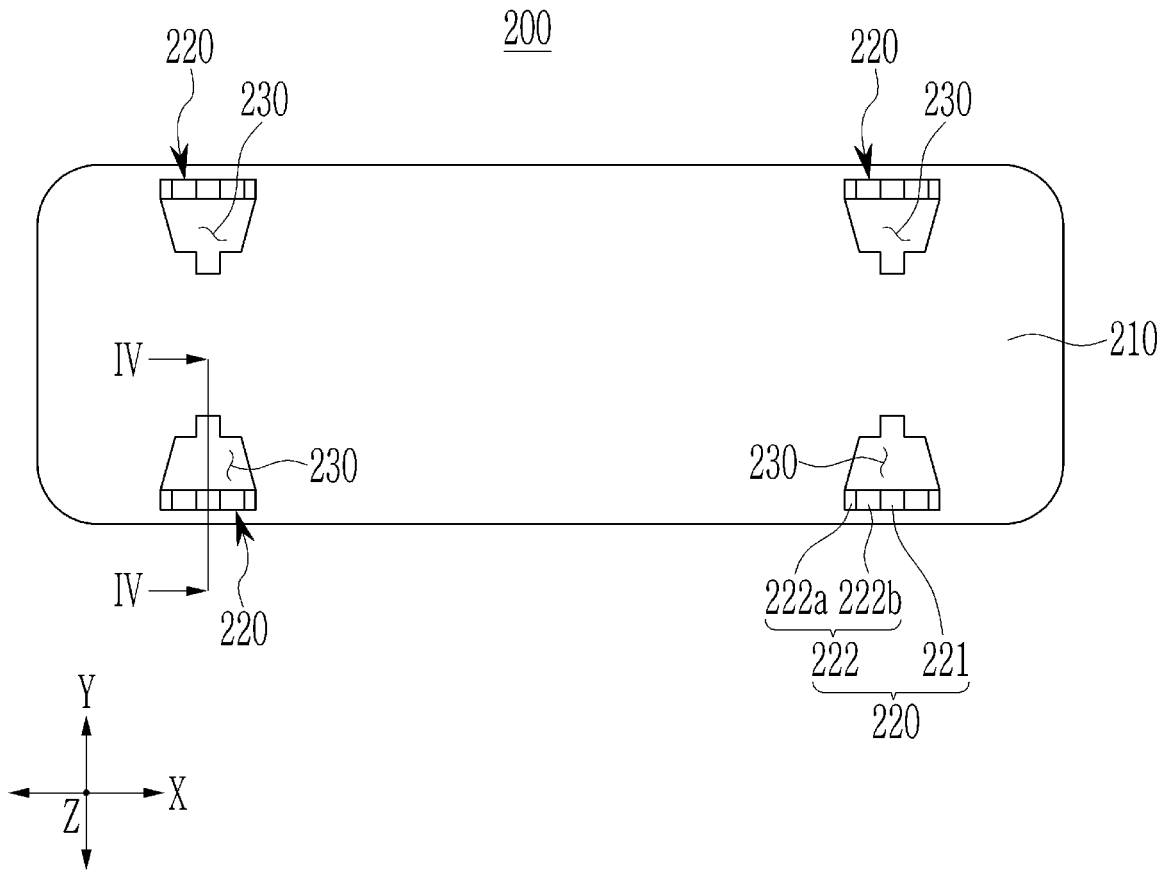
FIG. 2 is a top plan view illustrating a metal frame of a printed circuit board assembly according to an embodiment.
Figure 3:
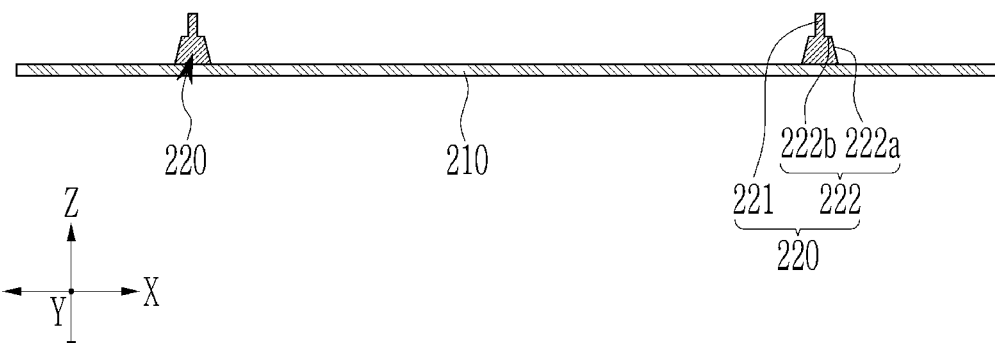
FIG. 3 is a side view illustrating a metal frame of a printed circuit board assembly according to an embodiment.
Figure 4:
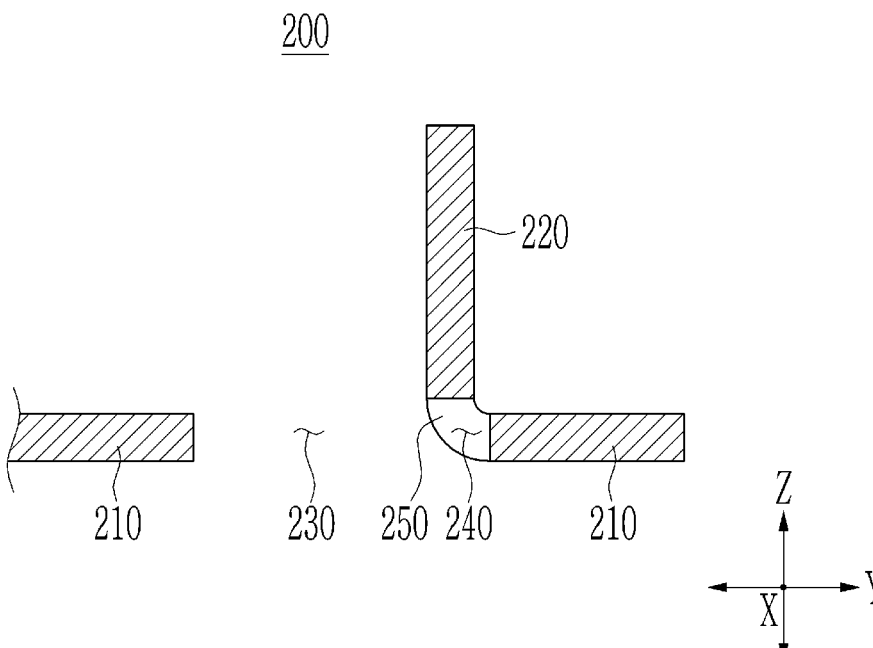
FIG. 4 is a cross-sectional view along IV-IV line of FIG. 2.

FIG. 2 is a top plan view illustrating a metal frame of a printed circuit board assembly according to an embodiment. FIG. 3 is a side view illustrating a metal frame of a printed circuit board assembly according to an embodiment. FIG. 4 is a cross-sectional view along IV-IV line of FIG. 2.

Referring to FIGS. 2 to 4, the metal frame 200 includes a plate portion 210, a plurality of supports 220, a plurality of through-holes 230, a plurality of through-hinges 240, and a plurality of connecting hinges 250.

The plate portion 210 may be opposite to or face-to-face with the printed circuit board 100.

The plate portion 210 may include a metal containing nickel (Ni), but is not limited thereto. In an implementation, the plate portion 210 may include various known metals such as aluminum (Al) and stainless steel. The plate portion 210 may have a plate shape extending in a first direction X and in a second direction Y intersecting with the first direction X, but is not limited thereto. The plate portion 210 may be opposite to or face-to-face with the printed circuit board 100 in a third direction Z intersecting with the first and second directions X and Y. The plate portion 210 may be integral with the plurality of supports 220.

The plurality of supports 220, integral with the plate portion 210, may be bent and extend from the plate portion 210 to the printed circuit board 100 and inserted into the plurality of support holes 110 of the printed circuit board 100, to support the printed circuit board 100. The plurality of supports 220 support the printed circuit board 100, so that the printed circuit board 100 is supported on the metal frame 200 while maintaining a certain distance from the metal frame 200.

As described, the plurality of supports 220 may be bent and extend in the third direction Z from the plate portion 210 and inserted into the plurality of support holes 110 of the printed circuit board 100. The plurality of supports 220 may extend in the first direction X and the second direction Y inside the plurality of through-holes 230 of the plate portion 210, and are separated from the plurality of through-holes 230, bent in the third direction Z from the plate portion 210, and may protrude and extend from the plate portion 210 in the third direction Z. The plurality of supports 220 may be positioned closer to the corners of the first direction X and the second direction Y of the plate portion 210 than to the center of the first direction X and the second direction Y of the plate portion 210, and may be positioned at the corners of the plate portion 210. Each of the plurality of supports 220 may include an insertion portion 221 and a support portion 222.

The insertion portion 221 may be inserted into each of the plurality of support holes 110 of the printed circuit board 100. The insertion portion 221 may protrude from the support portion 222 in the third direction Z. A planar shape of the insertion portion 221 may have the same shape as that of the support hole 110, but is not limited thereto.

The support portion 222 may extend from the insertion portion 221 to the plate portion 210. The support portion 222 may be positioned between the plate portion 210 and the insertion portion 221 and may contact the rear surface of the printed circuit board 100 in the third direction Z to support the printed circuit board 100.

The support portion 222 may include a side portion 222a and an upper portion 222b.

The side portion 222a may extend at an incline from the plate portion 210 toward the printed circuit board 100. The side portion 222a may extend at an incline from the front surface of the plate portion 210 based on the third direction Z.

The upper portion 222b may be positioned between the side portion 222a and the insertion portion 221 and may contact the rear surface of the printed circuit board 100 in the third direction Z.

The side portion 222a of the support portion 222 extends inclined from the upper portion 222b contacting the rear surface of the printed circuit board 100 to the front surface of the plate portion 210, so that the printed circuit board 100 is firmly supported to the support 220.

The plurality of through-holes 230 may be positioned adjacent to the plurality of supports 220. The plurality of through-holes 230 may penetrate the plate portion 210 in the third direction Z. The planar shape of the plurality of through-holes 230 may be the same as the side shape of the plurality of supports 220. The number of the plurality of through-holes 230 may be the same as the number of the plurality of supports 220. The plurality of supports 220 may be separated from the plurality of through-holes 230 and may be bent and may be extended in the third direction Z from the plate portion 210, so that the planar shape of the plurality of through-holes 230 is the same as the side shape of the plurality of supports 220, and the number of the plurality of through-holes 230 is the same as the number of the plurality of supports 220.

Figure 6:
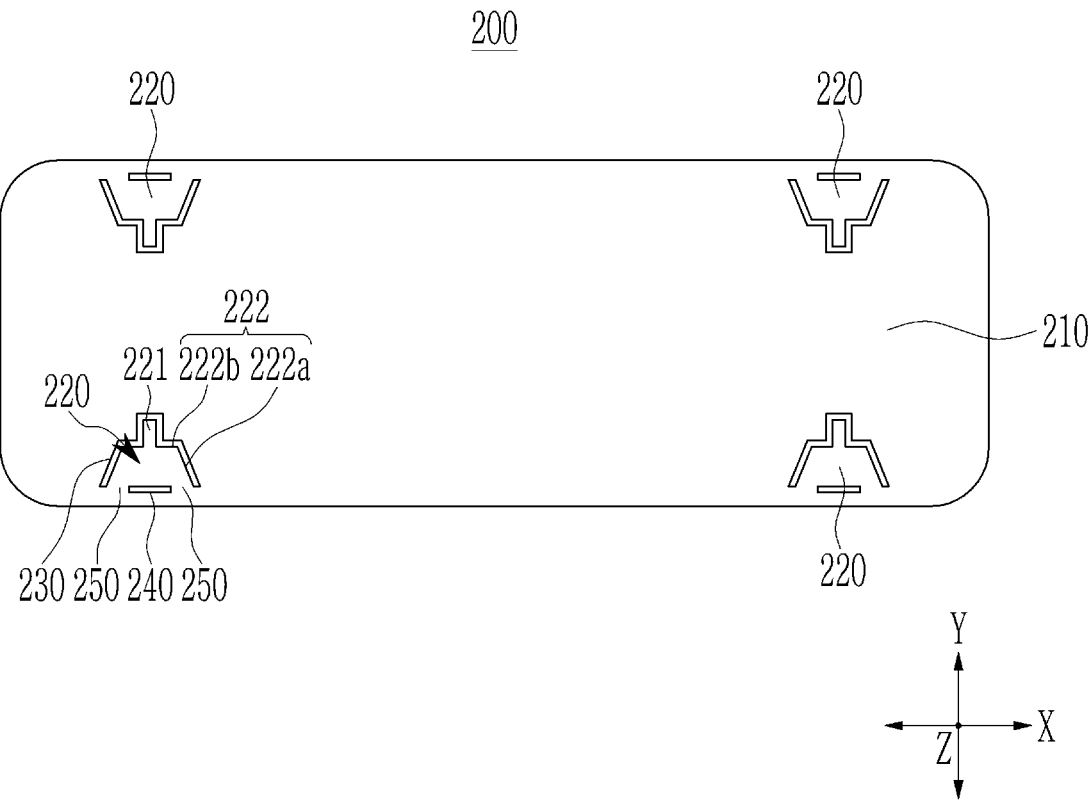
FIGS. 6 and 7 are plan views of a metal frame for describing a method for manufacturing a printed circuit board assembly according to an embodiment.
Figure 7:
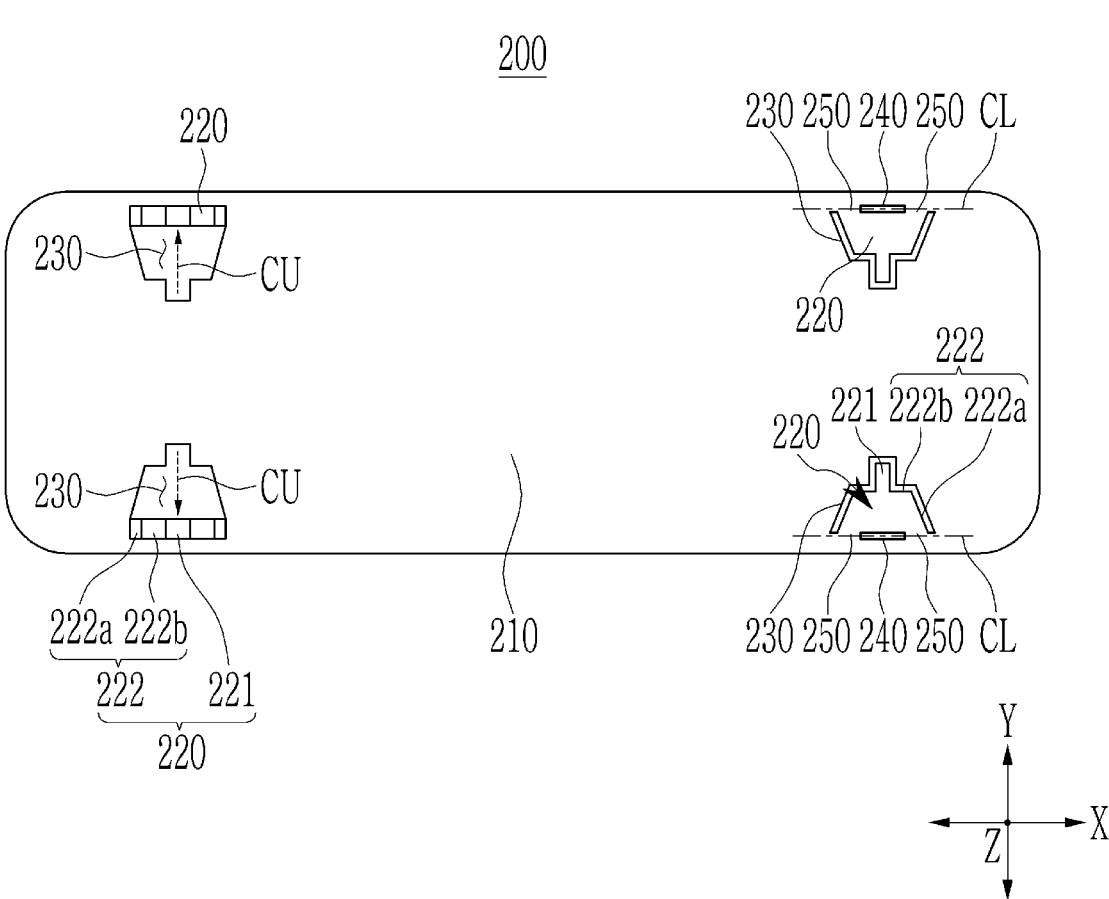

The plurality of through-hinges 240 are shown in FIG. 4 and FIGS. 6 and 7 to be described later. The plurality of through-hinges 240 may penetrate between the plurality of supports 220 and the plate portion 210 in the third direction Z. The plurality of through-hinges 240 may extend linearly in the first direction X. Each of the plurality of through-hinges 240 may extend linearly to correspond to a partial region of the plurality of supports 220 in the first direction X.

The plurality of connecting hinges 250 are shown in FIG. 4 and FIGS. 6 and 7 to be described later. The plurality of connecting hinges 250 may connect between the plurality of supports 220 and the plate portion 210. Each of the plurality of connecting hinges 250 may connect in a curved manner each of the plurality of supports 220 and the plate portion 210 with each of the plurality of through-hinges 240 therebetween.

The plurality of supporters 220 may be separated from the plurality of through-holes 230 by the plurality of connecting hinges 250 and the plurality of through-hinges 240 so as to be easily bent and extended from the plate portion 210 in the third direction Z. The metal frame 200 and the printed circuit board 100 may be bonded by the plurality of bonding portions 300.

Referring to FIG. 1, the plurality of bonding portions 300 may be positioned between the metal frame 200 and the printed circuit board 100. The plurality of bonding portions 300 may bond between the metal frame 200 and the printed circuit board 100. Each of the plurality of bonding portions 300 may include solder. Each of the plurality of bonding portions 300 may have a different thickness due to inherent characteristics of solder formed by a soldering process. Each of the plurality of bonding portions 300 may have different an area due to inherent characteristics of solder formed by a soldering process.

As such, the printed circuit board assembly 1000 according to embodiments may include a metal frame 200, including a plurality of supports 220 that may be integral with the metal frame 200 and that may be bent and extend toward the printed circuit board 100 and that may be inserted into the plurality of support holes 110 of the printed circuit board 100 to support the printed circuit board 100. Accordingly, the printed circuit board 100 may be supported on the metal frame 200 while maintaining a constant distance from the metal frame 200, even if deviation occurs in the thickness and area of each of the plurality of bonding portions 300 bonding between the metal frame 200 and the printed circuit board 100.

In addition, in the printed circuit board assembly 1000 in accordance with embodiments, a short circuit between the metal frame 200 and the printed circuit board 100 may be suppressed by maintaining a constant distance between the metal frame 200 and the printed circuit board 100, even if deviation occurs in the thickness and area of each of the plurality of bonding portion portions 300 because the plurality of bonding portions 300 include solder.

In an implementation, in accordance with embodiments, there is provided a printed circuit board assembly 1000 in which the plurality of supports 220 integral with the metal frame 200 bend and extend from the metal frame 200 toward the printed circuit board 100 to support the printed circuit board 100, such that a short circuit between the metal frame 200 and the printed circuit board 100 are suppressed by maintaining a constant distance between the metal frame 200 and the printed circuit board 100, even if no separate structure is added between the metal frame 200 and the printed circuit board 100.

Hereinafter, a method for manufacturing a printed circuit board assembly according to an embodiment will be described with reference to FIGS. 5 to 9. The printed circuit board assembly according to the above-described embodiment may be manufactured using a method for manufacturing a printed circuit board assembly according to another embodiment, but is not limited thereto.

Figure 5:
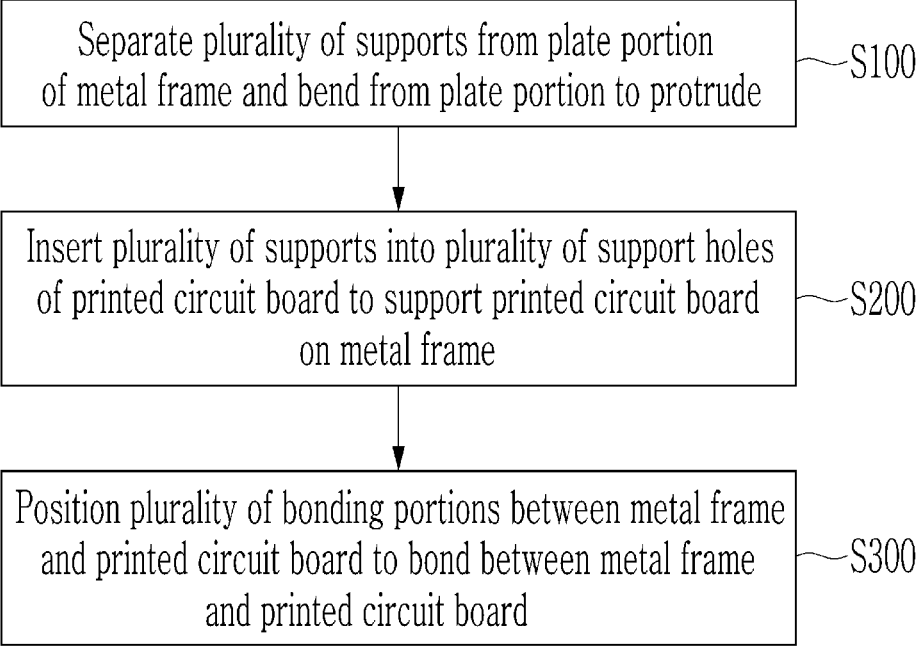
FIG. 5 is a flowchart illustrating a method for manufacturing a printed circuit board assembly according to an embodiment.

FIG. 5 is a flowchart illustrating a method for manufacturing a printed circuit board assembly according to an embodiment. FIGS. 6 and 7 are plan views of a metal frame for explaining or describing a method for manufacturing a printed circuit board assembly according to an embodiment.

Referring to FIGS. 5 to 7, the plurality of supports 220 may be separated from the plate portion 210 of the metal frame 200 and may be bent from the plate portion 210 so as to protrude (S100) from the plate portion 210.

Referring to FIG. 6, the plurality of through-holes 230 that may be adjacent to the plurality of supports 220 and that may penetrate the plate portion 210 are formed on the metal frame 200. The plurality of through-holes 230 may be formed along the edges of the plurality of supports 220, and the plurality of supports 220 may be integrally formed with the metal frame 200 in the same shape as the plurality of through-holes 230. The plurality of through-hinges 240 may be formed to linearly penetrate between the plurality of supports 220 and the plate portion 210 in the first direction X. The plurality of connecting hinges 250 may be formed to be spaced apart in the first direction X with the through-hinge 240 therebetween according to the formation of the plurality of through hinges 240 to connect the plate portion 210 and the plurality of supports 220.

Referring to FIG. 7, the plurality of supports 220 may be separated from the plurality of through-holes 230 based on a bending line CL, that may be in an extending direction of the plurality of through-hinges 240 penetrating between the plurality of supports 220 and the plate portion 210, and bent CU in the third direction Z that intersects with the first direction X from and at the plate portion 210.

Between the plurality of supports 220, bent CU in the third direction Z and the plate portion 210 may be connected by a plurality of curved or bent connecting hinges 250.

Figure 8:
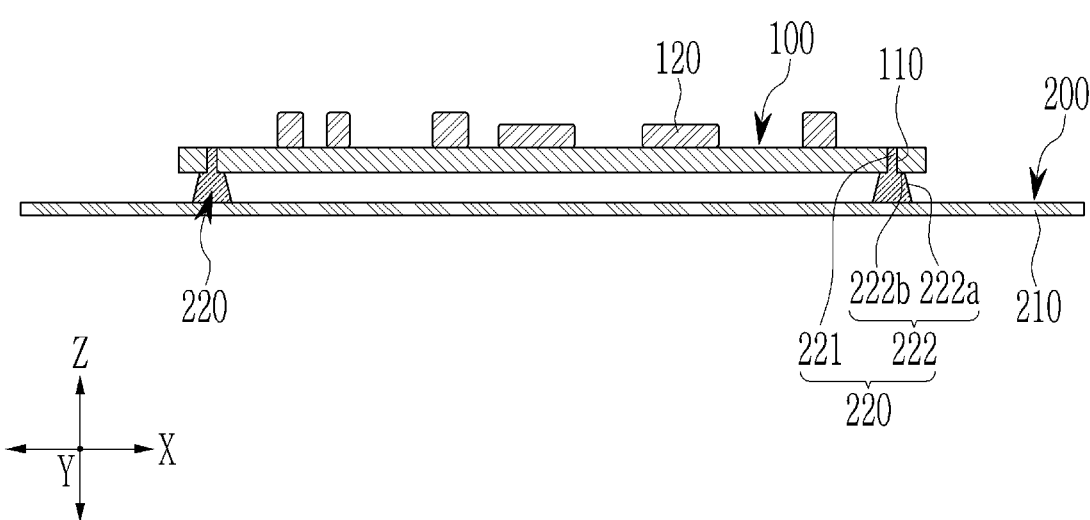
FIGS. 8 and 9 are cross-sectional views of a printed circuit board assembly for describing a method for manufacturing a printed circuit board assembly according to an embodiment.
Figure 9:
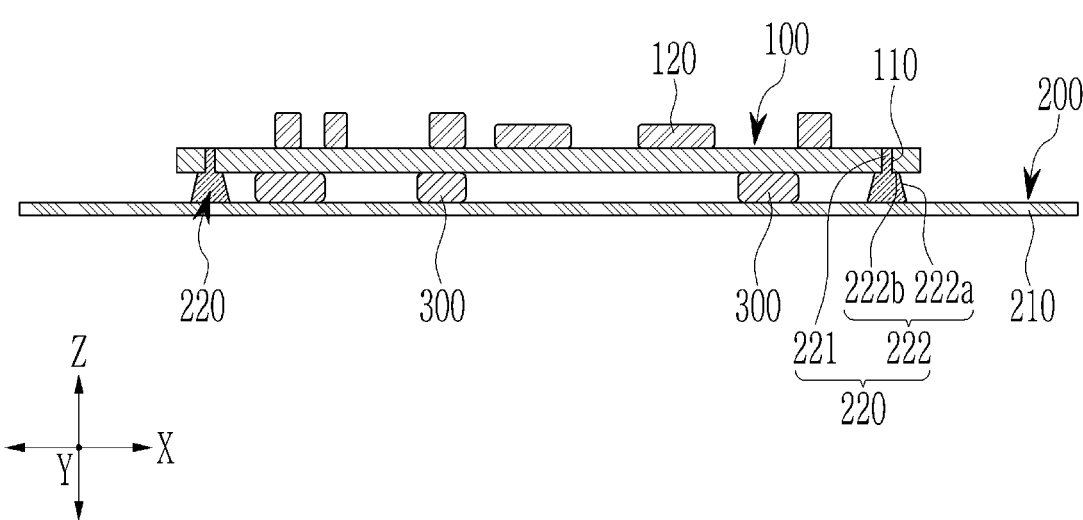

FIGS. 8 and 9 are cross-sectional views of a printed circuit board assembly for explaining and describing a method for manufacturing a printed circuit board assembly according to an embodiment.

Referring to FIG. 8, the plurality of supports 220 may be inserted into the plurality of support holes 110 of the printed circuit board 100 to support the printed circuit board 100 on the metal frame 200 (S200).

In an implementation, the printed circuit board 100 may be positioned on the metal frame 200, and the plurality of supports 220 of the metal frame 200 may be inserted into the plurality of supports 220 of the printed circuit board 100 to support the printed circuit board 100 on the plurality of supports 220 of the metal frame 200. As a result, the printed circuit board 100 may be supported on the metal frame 200 while maintaining a constant distance from the metal frame 200.

Referring to FIG. 9, the plurality of bonding portions 300 may be positioned between the metal frame 200 and the printed circuit board 100 to bond between the metal frame 200 and the printed circuit board 100 (S300).

In an implementation, the metal frame 200 and the printed circuit board 100 may be bonded by soldering a plurality of joints 300 between the metal frame 200 and the printed circuit board 100.

Each of the plurality of bonding portions 300 may have a different thickness and area due to the inherent characteristics of solder formed by a soldering process, but regardless of the thickness and area of the plurality of bonding portions 300, a constant distance is maintained between the printed circuit board 100 and the metal frame 200 by the plurality of supports 220.

A printed circuit board included in a protective circuit module of a secondary battery may have the form of a printed circuit board assembly bonded to a metal frame supported inside the case of the secondary battery. A conventional printed circuit board assembly may include a metal frame, a printed circuit board bonded to the metal frame, and a plurality of bonding agents bonded between the metal frame and the printed circuit board. The conventional printed circuit board assembly, however, has an issue where deviations and variations occur in the distance between the metal frame and the printed circuit board, depending on the difference in thickness of each of a plurality of adhesives positioned therebetween, and various problems and shortcomings of the conventional printed circuit board assembly are avoided by the present printed circuit board assembly that may be made and manufactured as described above.

According to an implementation of embodiments, in a method for manufacturing a printed circuit board assembly, the plurality of supports 220 integral with the metal frame 200 may be bent to extend from the metal frame 200 toward the printed circuit board 100 to support the printed circuit board 100, such that a short circuit between the metal frame 200 and the printed circuit board 100 may be suppressed by maintaining a constant distance between the metal frame 200 and the printed circuit board 100, even if no separate structure is added between the metal frame 200 and the printed circuit board 100.

In an implementation, there is provided a method for manufacturing a printed circuit board assembly in which a short circuit between the metal frame 200 and the printed circuit board 100 may be suppressed by maintaining a constant distance between the metal frame 200 and the printed circuit board 100, even if no separate structure is added between the metal frame 200 and the printed circuit board 100.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A printed circuit board assembly, comprising:
   a printed circuit board having a plurality of support holes;
   a metal frame supporting the printed circuit board; and
   a plurality of bonding portions between the metal frame and the printed circuit board bonding the metal frame and the printed circuit board,
   wherein the metal frame includes:
   a plate portion opposite the printed circuit board; and
   a plurality of supports that is:
      integral with the plate portion,
      bent and extending from the plate portion to the printed circuit board,
      inserted into the plurality of support holes, and
      supporting the printed circuit board.

2. The printed circuit board assembly as claimed in claim 1, wherein the metal frame further comprises a plurality of through-holes adjacent to the plurality of supports and penetrating the plate portion.

3. The printed circuit board assembly as claimed in claim 2, wherein a planar shape of the plurality of through-holes is the same as a side shape of the plurality of supports.

4. The printed circuit board assembly as claimed in claim 2, wherein the number of the plurality of through-holes is the same as the number of the plurality of supports.

5. The printed circuit board assembly as claimed in claim 2, wherein the plurality of supports are separated from the plurality of through-holes and bent from the plate portion to protrude from the plate portion.

6. The printed circuit board assembly as claimed in claim 2, wherein the metal frame further comprises a plurality of through-hinges penetrating between the plurality of supports and the plate portion.

7. The printed circuit board assembly as claimed in claim 6, wherein the metal frame further comprises a plurality of connecting hinges that curve and connect between each of the plurality of supports and the plate portion with each of the plurality of through-hinges interposed therebetween.

8. The printed circuit board assembly as claimed in claim 6, wherein the plurality of through-hinges are linear.

9. The printed circuit board assembly as claimed in claim 1, wherein each of the plurality of supports comprises:

an insertion portion inserted into each of the plurality of support holes; and a support portion extending from the insertion portion to the plate portion and supporting the printed circuit board.

10. The printed circuit board assembly as claimed in claim 9, wherein the support portion comprises:

a side portion extending at an incline from the plate portion toward the printed circuit board; and an upper portion positioned between the side portion and the insertion portion and contacting the printed circuit board.

11. The printed circuit board assembly as claimed in claim 1, wherein each of the plurality of bonding portions has a different thickness.

12. The printed circuit board assembly as claimed in claim 11, wherein each of the plurality of bonding portions has a different area.

13. The printed circuit board assembly as claimed in claim 11, wherein each of the plurality of bonding portions includes solder.

14. The printed circuit board assembly as claimed in claim 1, wherein the plurality of supports are closer to a corner of the plate portion than to a center of the plate portion.

15. A method for manufacturing a printed circuit board assembly, comprising:

separating a plurality of supports from a plate portion of a metal frame and bending the plurality of supports from the plate portion to protrude from the plate portion;

supporting the printed circuit board on the metal frame by inserting the plurality of supports into a plurality of support holes of the printed circuit board; and bonding the metal frame and the printed circuit board using a plurality of bonding portions between the metal frame and the printed circuit board.

16. The method for manufacturing a printed circuit board assembly as claimed in claim 15, wherein the separating of the plurality of supports from the plate portion of the metal frame and bending the plurality of supports from the plate portion to protrude from the plate portion comprises forming a plurality of through-holes adjacent to the plurality of supports and penetrating the plate portion on the metal frame.

17. The method for manufacturing the printed circuit board assembly as claimed in claim 16, wherein the separating of the plurality of supports from the plate portion of the metal frame and bending the plurality of supports from the plate portion to protrude from the plate portion is performed by separating the plurality of supports from the plurality of through-holes along a plurality of through-hinges penetrating between the plurality of supports and the plate portion, and bending the plurality of supports from the plate portion.

18. The method for manufacturing the printed circuit board assembly as claimed in claim 17, wherein the plurality of through-hinges are linear.

19. The method for manufacturing the printed circuit board assembly as claimed in claim 15, wherein the bonding of the metal frame and the printed circuit board by positioning the plurality of bonding portions between the metal frame and the printed circuit board is performed by soldering the plurality of bonding portions between the metal frame and the printed circuit board.

20. The method for manufacturing the printed circuit board assembly as claimed in claim 19, wherein each of the plurality of bonding portions has a different thickness.

* * * * *